US012574067B2

(12) United States Patent　　　　(10) Patent No.: US 12,574,067 B2

Gemmer et al.　　　　　　　　　　　(45) Date of Patent:　　Mar. 10, 2026

(54) MEASUREMENT SYSTEM AND METHOD ENABLING OVER-THE-AIR MEASUREMENTS IN FULL-DUPLEX MODE FOR TWO POLARISATIONS

(71) Applicant: Rohde & Schwarz GmbH & Co. KG, Munich (DE)

(72) Inventors: Thomas Gemmer, Munich (DE); Nico Riedmann, Munich (DE); Adam Tankielun, Ottobrunn (DE); Hendrik Bartko, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 383 days.

(21) Appl. No.: 18/177,843

(22) Filed: Mar. 3, 2023

(65) Prior Publication Data

US 2024/0297679 A1　　Sep. 5, 2024

(51) Int. Cl.
　　H04B 1/525　　　(2015.01)
　　H01P 5/18　　　　(2006.01)
　　H03H 7/48　　　　(2006.01)
(52) U.S. Cl.
　　CPC ............... H04B 1/525 (2013.01); H01P 5/18 (2013.01); H03H 7/48 (2013.01)
(58) Field of Classification Search
　　CPC ............................ H04W 24/06; H04W 24/08
　　See application file for complete search history.

(56) References Cited

U.S. PATENT DOCUMENTS

| | | | | |
|---|---|---|---|---|
| 8,478,263 | B1 * | 7/2013 | Lan ........................ | H04W 24/08 |
| | | | | 455/115.2 |
| 10,644,763 | B1 | 5/2020 | Watkins | |
| 2007/0136046 | A1 * | 6/2007 | Liu ........................ | H04L 41/145 |
| | | | | 703/27 |
| 2008/0261534 | A1 * | 10/2008 | Wang .................... | H04W 52/04 |
| | | | | 455/67.11 |
| 2009/0094492 | A1 * | 4/2009 | Music ................ | H04B 17/3911 |
| | | | | 714/E11.159 |
| 2011/0230143 | A1 * | 9/2011 | Lundstrom ........... | H04W 24/06 |
| | | | | 455/67.11 |
| 2014/0087668 | A1 * | 3/2014 | Mow ..................... | H04W 24/08 |
| | | | | 455/67.14 |
| 2017/0317717 | A1 * | 11/2017 | Trojer ...................... | H04B 3/46 |
| 2017/0358857 | A1 | 12/2017 | Watkins | |
| 2019/0348760 | A1 * | 11/2019 | Lee ...................... | G01R 29/105 |

* cited by examiner

*Primary Examiner* — Wen W Huang

(74) *Attorney, Agent, or Firm* — Studebaker Brackett PLLC

(57)　　　　　　　ABSTRACT

A measurement system is provided. Said measurement system comprises a first measurement chain, a second measurement chain, a radio frequency hybrid coupler, a first radio frequency port connected to the first measurement chain via the radio frequency hybrid coupler, a second radio frequency port connected to the second measurement chain via the radio frequency hybrid coupler, a first attenuator or a first radio frequency switch for the first radio frequency port, and a second attenuator or a second radio frequency switch for the second radio frequency port. In this context, a first transmission coefficient of the first attenuator or the first radio frequency switch is controllable. In addition to this, a second transmission coefficient of the second attenuator or the second radio frequency switch is controllable.

17 Claims, 8 Drawing Sheets

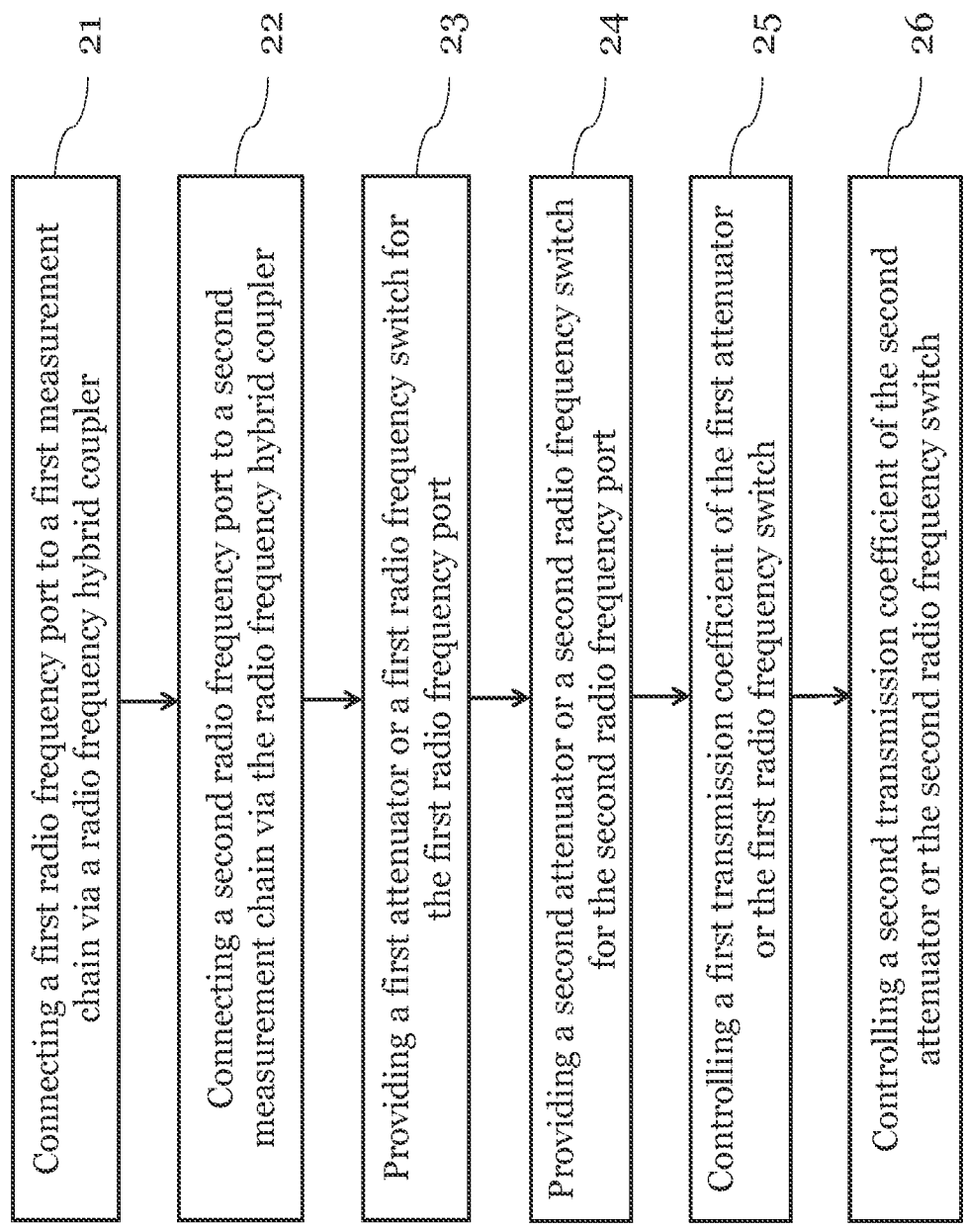

21 Connecting a first radio frequency port to a first measurement chain via a radio frequency hybrid coupler 22 Connecting a second radio frequency port to a second measurement chain via the radio frequency hybrid coupler 23 Providing a first attenuator or a first radio frequency switch for the first radio frequency port 24 Providing a second attenuator or a second radio frequency switch for the second radio frequency port 25 Controlling a first transmission coefficient of the first attenuator or the first radio frequency switch 26 Controlling a second transmission coefficient of the second attenuator or the second radio frequency switch

Fig. 8

MEASUREMENT SYSTEM AND METHOD ENABLING OVER-THE-AIR MEASUREMENTS IN FULL-DUPLEX MODE FOR TWO POLARISATIONS

TECHNICAL FIELD

The disclosure relates to over-the-air measurements that can be performed in full-duplex mode for two polarizations. The disclosure proposes a measurement system, a measurement method, and a computer program, which enable such over-the air measurements.

BACKGROUND ART

Generally, in times of an increasing number of communication applications providing wireless connectivity capabilities, there is a growing need of measurement systems and measurement methods for performing such over-the-air measurements in full-duplex mode with respect to such communication applications, in order to verify their correct functioning in an efficient manner.

For instance, document US 2017/0358857 A1 discloses a system and method for duplexing radio frequency signals for full-duplex transmission and reception by an antenna. The system comprises a signal coupler comprising an antenna node configured to be connected to the antenna, an input node for receiving radio frequency signals for transmission by the antenna, an output node for outputting radio frequency signals received by the antenna, and a coupling node. The system further comprises a variable impedance element connected to the coupling node to reduce interference between the signals for transmission by the antenna and the signals received by the antenna, the variable impedance element comprising a variable phase shifter connected to a variable attenuator.

Furthermore, document U.S. Pat. No. 10,644,763 B1 relates to a full duplex system comprising a combiner with a first port connected to an antenna, a second port connectable to a source of a signal to be transmitted via the antenna, a third port for outputting a signal received via the antenna and a fourth port connected to a variable impedance. The variable impedance comprises a power splitter with an input connected to the fourth port and at least two outputs, wherein at least two outputs are connected to each other via variable phase shifting and attenuation circuitry.

Moreover, conventional measurement systems for performing measurements in full-duplex mode are expensive and require a lot of space.

SUMMARY

Thus, there is a need to provide a measurement system and a measurement method that allow performing over-the-air measurements in full-duplex mode in an efficient manner. An inexpensive and compact solution is desired.

This is achieved by the solutions provided in the independent claims. Advantageous implementations are described in the dependent claims.

According to a first aspect of this disclosure, a measurement system is provided. Said measurement system comprises a first measurement chain, a second measurement chain, a radio frequency hybrid coupler, a first radio frequency port connected to the first measurement chain via the radio frequency hybrid coupler, a second radio frequency port connected to the second measurement chain via the radio frequency hybrid coupler, a first attenuator or a first radio frequency switch for the first radio frequency port, and a second attenuator or a second radio frequency switch for the second radio frequency port. In this context, a first transmission coefficient of the first attenuator or the first radio frequency switch is controllable. In addition to this, a second transmission coefficient of the second attenuator or the second radio frequency switch is controllable. Advantageously, over-the-air measurements can be performed in a particularly efficient manner especially regarding efforts and costs.

The measurement system of the first aspect provides an inexpensive and compact solution for performing over-the-air measurements in full-duplex mode. This is, for instance, achieved by using only one RF hybrid couple and two measurement chains, instead of Wilkinson power dividers as some conventional measurement systems.

According to a first implementation form of the first aspect of this disclosure, the first measurement chain is configured as a receive measurement chain. In addition to this or as an alternative, the second measurement chain is configured as a transmit measurement chain. Advantageously, for instance, two signal directions can be measured, thereby increasing efficiency.

According to a second implementation form of the first aspect of this disclosure, the first measurement chain comprises and/or uses a first frequency converter. In addition to this or as an alternative, the second measurement chain comprises and/or uses a second frequency converter. Advantageously, for example, the number of frequency converters needed can be reduced to a minimum, thereby saving costs.

According to a further implementation form of the first aspect of this disclosure, the first radio frequency port comprises or is connected to a first antenna. In addition to this or as an alternative, the second radio frequency port comprises or is connected to a second antenna. Advantageously, for instance, complexity can be kept low, which leads to an increased efficiency.

According to a further implementation form of the first aspect of this disclosure, the first antenna is configured for a first polarization. In addition to this or as an alternative, the second antenna is configured for a second polarization. Advantageously, for example, two polarizations can be measured in an efficient manner.

According to a further implementation form of the first aspect of this disclosure, the first polarization is different from the second polarization. In addition to this or as an alternative, the first polarization is orthogonal to the second polarization. Advantageously, for instance, inefficiencies can further be reduced.

According to a further implementation form of the first aspect of this disclosure, the first attenuator and the second attenuator or the first radio frequency switch and the second radio frequency switch are respectively configured such that only one of the first attenuator and the second attenuator or only one the first radio frequency switch and the second radio frequency switch is enabled at the same time. Advantageously, for example, especially if only one polarization is required, the corresponding signal from the respective undesired antenna can efficiently be suppressed.

According to a further implementation form of the first aspect of this disclosure, the first transmission coefficient is controllable to be alternated between 0 and 100%, for instance between 1% and 99%, or for instance between 5% and 95%, or for instance between 10% and 90%. In addition to this or as an alternative, the second transmission coefficient is controllable to be alternated between 0 and 100%, for instance between 1% and 99%, or for instance between 5% and 95%, or for instance between 10% and 90%. For instance, the transmission coefficients may be alternated between full transmission and no transmission.

According to a further implementation form of the first aspect of this disclosure, the measurement system further comprises an orthomode transducer for the first radio frequency port and the second radio frequency port. Advantageously, for example, crosstalk can efficiently be attenuated.

According to a further implementation form of the first aspect of this disclosure, the measurement system further comprises a dual polarized antenna, for example a dual polarized antenna with two orthogonal polarizations, connected to the first radio frequency port and the second radio frequency port. Advantageously, for instance, efficiency can further be increased.

According to a further implementation form of the first aspect of this disclosure, the measurement system further comprises a measurement chamber, for instance, an over-the-air measurement chamber. In this context, the first antenna and the second antenna are located at two different locations within said measurement chamber, for instance, said over-the-air measurement chamber. Advantageously, for example, measurements with respect to multiple input multiple output applications can efficiently be performed.

According to a further implementation form of the first aspect of this disclosure, the first antenna and the second antenna are arranged to transmit into and/or receive from different directions. Advantageously, for instance, efficiency can further be increased especially in the context of multiple input multiple output measurements.

According to a further implementation form of the first aspect of this disclosure, the first transmission coefficient is controllable in magnitude and/or phase. In addition to this or as an alternative, the second transmission coefficient is controllable in magnitude and/or phase. Advantageously, for example, inefficiencies can further be reduced.

According to a further implementation form of the first aspect of this disclosure, the first transmission coefficient and the second transmission coefficient are controllable to be the same between the radio frequency hybrid coupler and the first radio frequency port and the second radio frequency port. Advantageously, for instance, efficiency can further be increased, which analogously applies for the following further implementation form of the first aspect of this disclosure.

According to a further implementation form of the first aspect of this disclosure, the first transmission coefficient and the second transmission coefficient are controllable to be the same between the radio frequency hybrid coupler and the first antenna and the second antenna.

According to a further implementation form of the first aspect of this disclosure, the measurement system is configured to perform at least one measurement with the first measurement chain and the second measurement chain at the same time. Advantageously, for example, a simultaneous measurement of two signal directions, especially in the sense of a full-duplex measurement, can be achieved.

According to a further implementation form of the first aspect of this disclosure, the first frequency converter is configured as a receive frequency converter. In addition to this or as an alternative, the second frequency converter is configured as a transmit frequency converter. Advantageously, for instance, only one frequency converter per signal direction is needed, thereby reducing costs.

According to a further implementation form of the first aspect of this disclosure, the radio frequency hybrid coupler comprises or is a 90 degree coupler or a 180 degree coupler.

Advantageously, for example, the radio frequency hybrid coupler, especially the 180 degree coupler, may comprise or be a magic tee coupler.

According to a second aspect of this disclosure, a measurement method using the measurement system of this disclosure is provided. Said measurement method comprises the steps of controlling the first transmission coefficient of the first attenuator or the first radio frequency switch, and controlling the second transmission coefficient of the second attenuator or the second radio frequency switch. Advantageously, for example, over-the-air measurements can be performed in a particularly efficient manner especially regarding efforts and costs.

According to a third aspect of this disclosure, it is provided a computer program with computer program means for performing at least a part of the steps, for example, all steps, of the second aspect of this disclosure if the computer program runs on a computer or a digital signal processor or the measurement system of this disclosure. Advantageously, for example, over-the-air measurements can be performed in a particularly efficient manner especially regarding efforts and costs.

The above description with regard to the measurement system according to the first aspect of the disclosure is correspondingly valid for the method according to the second aspect of the disclosure or for the computer program according to the third aspect of the disclosure, respectively.

BRIEF DESCRIPTION OF THE DRAWINGS

The above-described aspects and implementation forms of the present disclosure will be explained in the following description of specific embodiments in relation to the enclosed drawings, in which:

FIG. 8 shows a flow diagram of further embodiment of a measurement method of this disclosure.

DETAILED DESCRIPTIONS OF EMBODIMENTS

Figure 1:
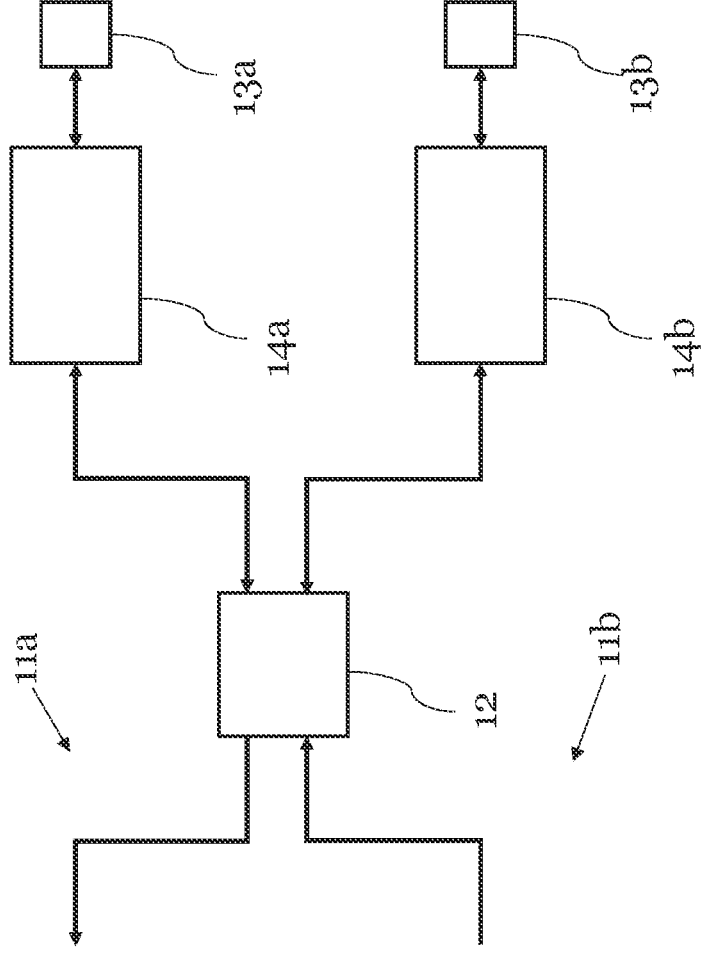
FIG. 1 shows a schematic diagram of a first exemplary embodiment of the measurement system of this disclosure.
Figure 1:
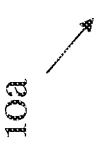

FIG. 1 depicts a schematic diagram of a first exemplary embodiment 10*a* of the measurement system of this disclosure.

According to said FIG. 1, the measurement system 10*a* comprises a first measurement chain 11*a*, a second measurement chain 11*b*, a radio frequency hybrid coupler 12, a first radio frequency port 13*a* connected to the first measurement chain 11*a* via the radio frequency hybrid coupler 12, a second radio frequency port 13*b* connected to the second measurement chain 11*b* via the radio frequency hybrid coupler 12, a first attenuator 14*a* for the first radio frequency port 13*a*, and a second attenuator 14*b* for the second radio frequency port 13*b*.

Figure 2:
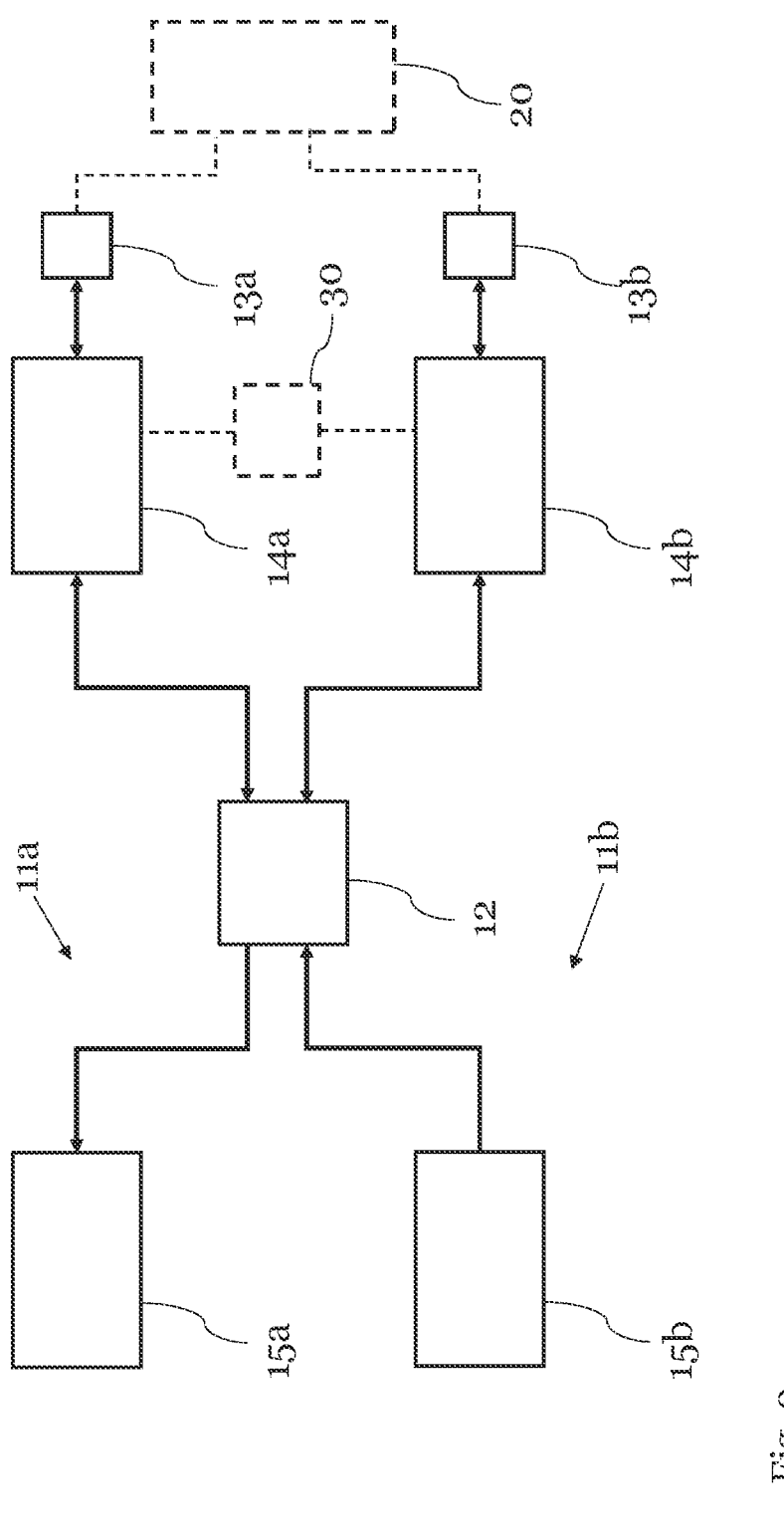
FIG. 2 shows a schematic diagram of a second exemplary embodiment of the measurement system of this disclosure.

It is noted that all the explanations below can analogously apply for the measurement system 10a according to FIG. 1 and vice versa. It is further noted that the second exemplary embodiment of FIG. 2 is based on the one of FIG. 1. Accordingly, identical parts and elements of the respective measurement system are equipped with the same reference signs, and thus not explained again.

FIG. 2 illustrates a schematic diagram of a second exemplary embodiment 10b of the measurement system of this disclosure.

In accordance with FIG. 2, said measurement system 10b comprises a first measurement chain 11a, a second measurement chain 11b, a radio frequency hybrid coupler 12, a first radio frequency port 13a connected to the first measurement chain 11a via the radio frequency hybrid coupler 12, a second radio frequency port 13b connected to the second measurement chain 11b via the radio frequency hybrid coupler 12, a first attenuator 14a for the first radio frequency port 13a, and a second attenuator 14b for the second radio frequency port 13b.

In particular, said first attenuator 14a is inserted between the radio frequency hybrid coupler 12 and the first radio frequency port 13a. Additionally, the second attenuator 14b is inserted between the radio frequency hybrid coupler 12 and the second radio frequency port 13b.

For the sake of completeness, it is noted that the first attenuator 14a can be substituted by a first radio frequency switch. Furthermore, the second attenuator 14b can be substituted by a second radio frequency switch. Nevertheless, especially for the sake of brevity, said alternatives are not explicitly mentioned in the following.

With respect to the measurement system 10b, it is noted that said measurement system 10b can especially be seen as an over-the-air measurement system. Said measurement system 10b may for example be used for performing measurements in the context of sixth generation mobile communications.

With respect to the first attenuator 14a and the second attenuator 14b, it is noted that a first transmission coefficient of the first attenuator 14a is controllable, whereas a second transmission coefficient of the second attenuator 14b is controllable.

The first transmission coefficient and/or the second transmission coefficient may be digitally controlled for instance via an inter-integrated circuit (I2C) interface and/or a serial peripheral interface (SPI).

Further, the first transmission coefficient may be controllable in magnitude and/or phase. In addition to this or as an alternative, the second transmission coefficient may be controllable in magnitude and/or phase.

Exemplarily, the first measurement chain 11a is configured as a receive measurement chain, whereas the second measurement chain 11b is configured as a transmit measurement chain.

Furthermore, the first measurement chain 11a or the receive measurement chain, respectively, may comprise and/or use a first frequency converter 15a or a receive frequency converter, respectively. In addition to this, the second measurement chain 11b or the transmit measurement chain, respectively, may comprise and/or use a second frequency converter 15b or a transmit frequency converter, respectively.

As it can further be seen from FIG. 2, the measurement system 10b may further comprises a device under test 20, for example, a two-port device under test, being in connection and/or communication with the first radio frequency port 13a and the second radio frequency port 13b.

With respect to the above-mentioned radio frequency hybrid coupler 12, it is noted that it might be advantageous, if said radio frequency hybrid coupler 12 comprises or is a wide-band coupler. Additionally or alternatively, the radio frequency hybrid coupler 12 may comprise or be a 90 degree coupler or a 180 degree coupler. The radio frequency hybrid coupler 12 may comprise or be a magic tee coupler.

Further, the radio frequency hybrid coupler 12 may especially be configured to ensure a high radio frequency isolation between the first measurement chain 11a and the second measurement chain 11b.

Again, with respect to the first attenuator 14a and the second attenuator 14b, it is noted that it might be advantageous if the first attenuator 14a and the second attenuator 14b are configured such that only one of the first attenuator 14a and the second attenuator 14b is enabled at the same time.

In this context, the term "enabled" can especially be understood in a manner that the corresponding attenuator is set to a minimum attenuation or a maximum transmission, respectively.

It is further noted that it might be advantageous if the first transmission coefficient is alternated between 0 and 100%, for example between 1% and 99%, or for example between 5% and 95%, or for example between 10% and 90%.

In addition to this or as an alternative, it might be advantageous if the second transmission coefficient is alternated between 0 and 100%, for example between 1% and 99%, or for example between 5% and 95%, or for example between 10% and 90%.

For example, the first transmission coefficient and/or the second transmission coefficient may be alternated between full transmission or maximum transmission, respectively, and no transmission or minimum transmission, respectively.

Moreover, it is noted that it might be advantageous if the first transmission coefficient and the second transmission coefficient are controlled to be the same between the radio frequency hybrid coupler 12 and the first radio frequency port 13a and the second radio frequency port 13b.

Especially for controlling the first transmission coefficient and/or the second transmission coefficient, the measurement system 10a may further comprise a control unit 30, especially a controller. Said control unit 30 or controller, respectively, may be connected to the first attenuator 14a and/or the second attenuator 14b.

It is further noted that it might be advantageous if the measurement system 10b is configured to perform at least one measurement with respect to the first measurement chain 11a and the second measurement chain 11b at the same time. The measurement system 10b may be configured to perform simultaneous measurements of two signal directions especially a receive signal direction and a transmit signal direction, or to perform full-duplex measurements, respectively.

Before further exemplary embodiments of the measurement system are explained in the following, it is noted that each of said further exemplary embodiments is based on the one according to FIG. 2. Accordingly, identical parts and elements of the respective measurement system are equipped with the same reference signs, and thus not explained again.

Figure 3:
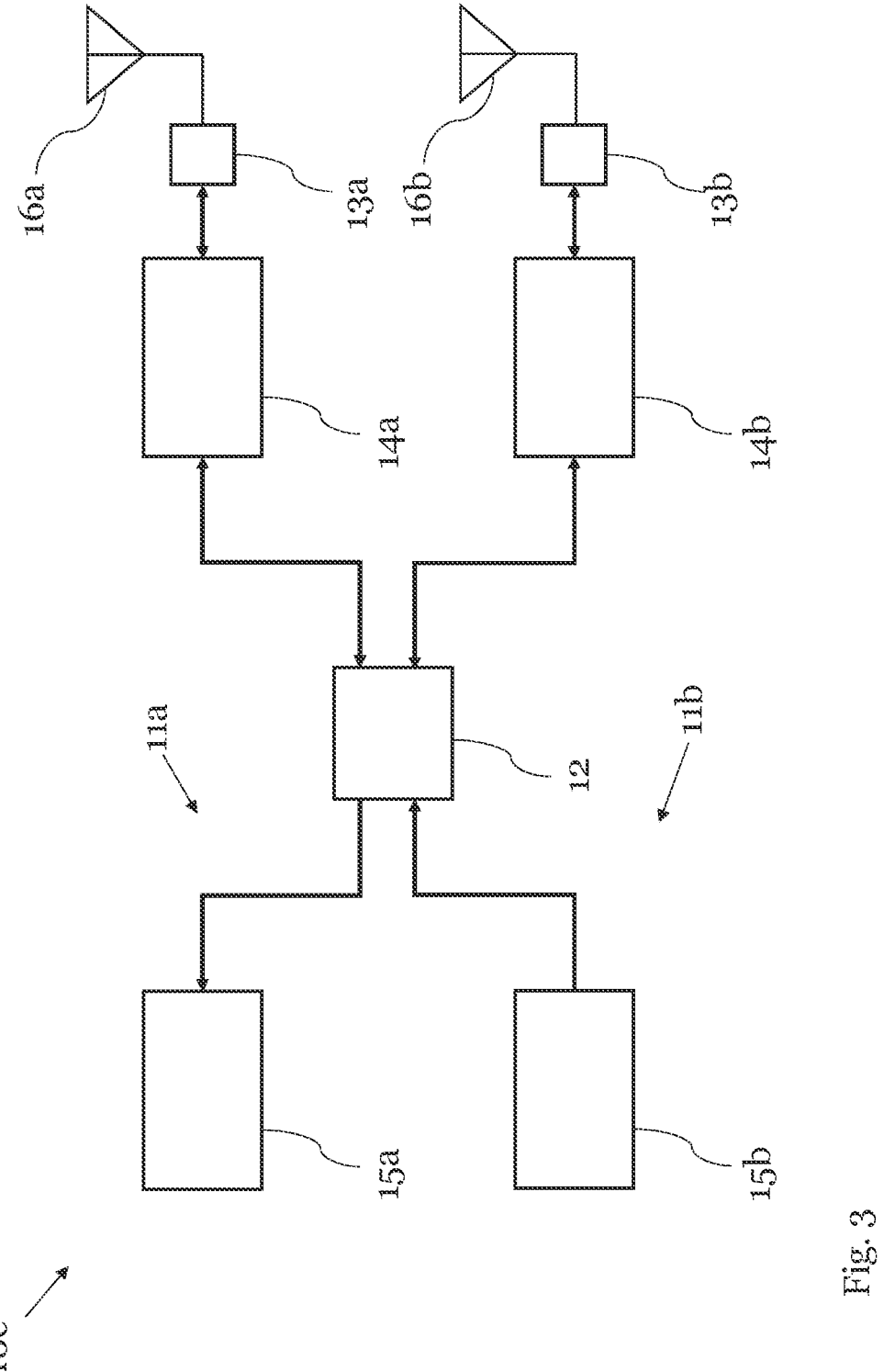
FIG. 3 shows a schematic diagram of a third exemplary embodiment of the measurement system of this disclosure.

Now, with respect to FIG. 3, a third exemplary embodiment 10c of the measurement system is depicted.

In accordance with said FIG. 3, the first radio frequency port 13a comprises a first antenna 16a. In addition to this, the second radio frequency port 13b comprises a second antenna 16b.

In particular, the first antenna 16$a$ is exemplarily connected to the first radio frequency port 13$a$, whereas the second antenna 16$b$ is exemplarily connected to the second radio frequency port 13$b$.

It is noted that measurement system 10$c$ may further comprise a device under test such as the device under test 20 of FIG. 2. Said device under test may be in communication with the first antenna 16$a$ and the second antenna 16$b$.

With respect to the first antenna 16$a$ and the second antenna 16$b$, it is noted that it might be advantageous if the first antenna 16$a$ comprises a first polarization and/or the second antenna 16$b$ comprises a second polarization. Accordingly, the first antenna 16$a$ may be configured for a first polarization and/or the second antenna 16$b$ may be configured for a second polarization.

In this context, the first polarization may be different from the second polarization. In addition to this or as an alternative, the first polarization may be orthogonal to the second polarization. Further additionally or further alternatively, the first antenna 16$a$ and the second antenna 16$b$ may point in different directions.

Figure 4:
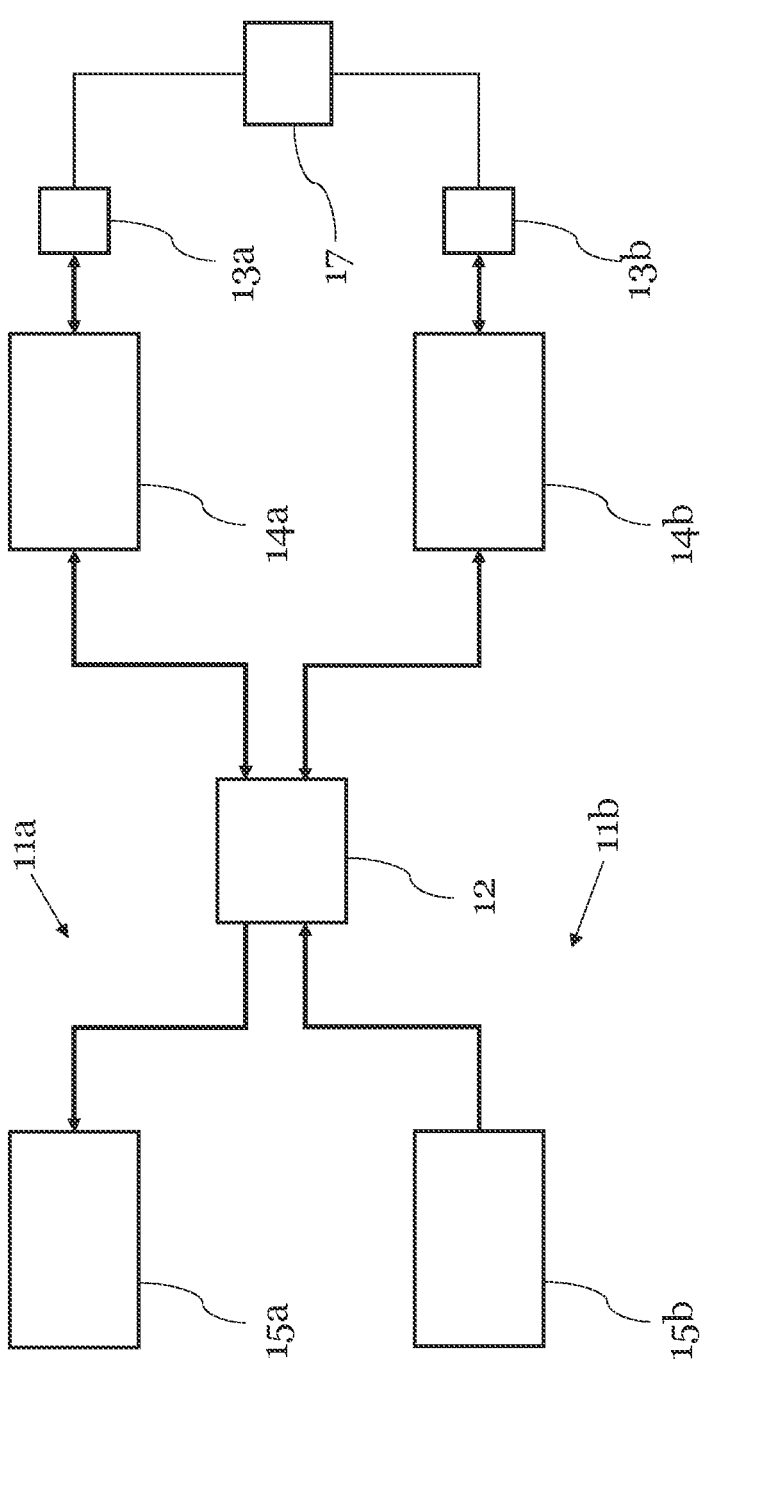
FIG. 4 shows a schematic diagram of a fourth exemplary embodiment of the measurement system of this disclosure.

In accordance with FIG. 4, a fourth exemplary embodiment 10$d$ of the measurement system is illustrated.

In this context, the measurement system 10$d$ comprises an orthomode transducer 17 for the first radio frequency port 13$a$ and the second radio frequency port 13$b$.

In particular, the orthomode transducer 17 is exemplarily connected to the first radio frequency port 13$a$ and the second radio frequency port 13$b$.

It is noted that measurement system 10$d$ may further comprise a device under test such as the device under test 20 of FIG. 2. Said device under test may be in communication with the orthomode transducer 17.

Figure 5:
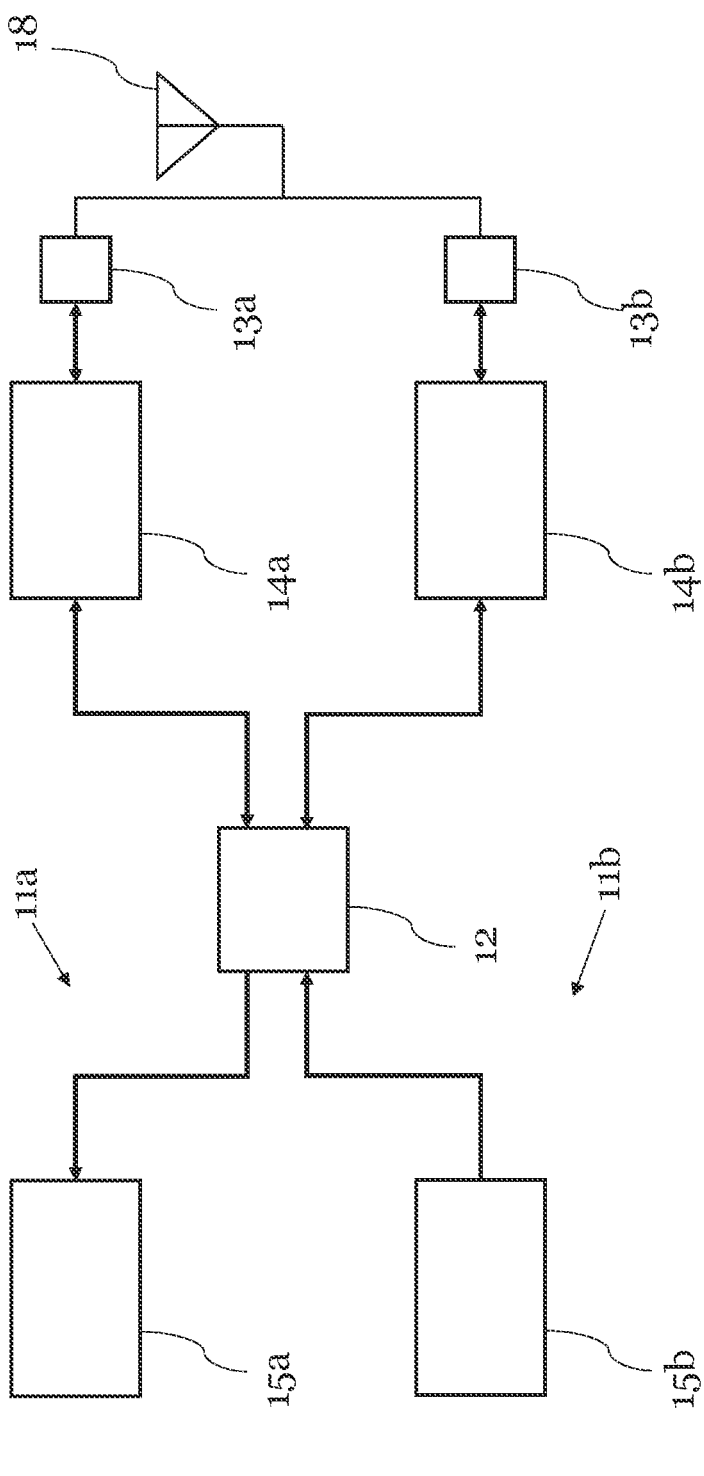
FIG. 5 shows a schematic diagram of a fifth exemplary embodiment of the measurement system of this disclosure.

According to FIG. 5, a fifth exemplary embodiment 10$e$ of the measurement system is illustrated.

As it can be seen, the measurement system 10$e$ comprises a dual polarized antenna 18, for example, a dual polarized antenna with orthogonal polarizations, for the first radio frequency port 13$a$ and the second radio frequency port 13$b$.

In particular, the dual polarized antenna 18, for example, the dual polarized antenna with orthogonal polarizations, is connected to the first radio frequency port 13$a$ and the second radio frequency port 13$b$.

It is noted that measurement system 10$e$ may further comprise a device under test such as the device under test 20 of FIG. 2. Said device under test may be in communication with the dual polarized antenna 18, for example, the dual polarized antenna with orthogonal polarizations.

Figure 6:
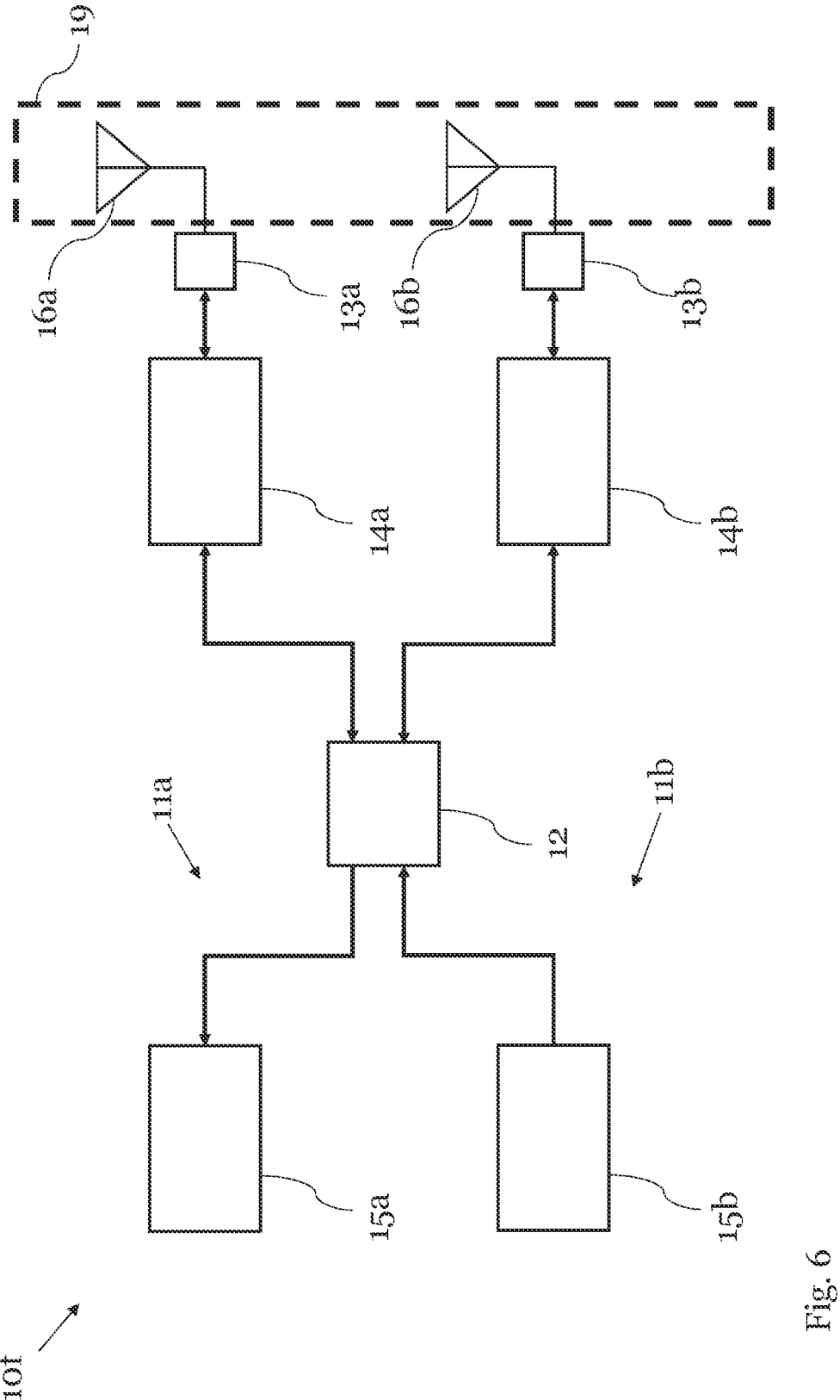
FIG. 6 shows a schematic diagram of a sixth exemplary embodiment of the measurement system of this disclosure.

Now, with respect to FIG. 6, a sixth exemplary embodiment 10$f$ of the measurement system is shown, which is especially based on the third exemplary embodiment 10$c$ according to FIG. 3.

As it can be seen from FIG. 6, the measurement system 10$f$ may comprise a measurement chamber 19, for example, an over-the-air measurement chamber, wherein the first antenna 16$a$ and the second antenna 16$b$ are located at two different locations within said measurement chamber 19, for example, said over-the-air measurement chamber. The measurement system 10$f$ may especially be used for performing measurements in the context of multiple input multiple output (MIMO).

It is noted that it might be advantageous if the first antenna 16$a$ and the second antenna 16$b$ point in different directions.

It is further noted that it might be advantageous if the first transmission coefficient and the second transmission coefficient are controlled to be the same between the radio frequency hybrid coupler 12 and the first antenna 16$a$ and the second antenna 16$b$.

Moreover, the measurement system 10$f$ may further comprise a device under test such as the device under test 20 of FIG. 2. Said device under test may be in communication with the first antenna 16$a$ and the second antenna 16$b$. Additionally or alternatively, said device under test may be located within the measurement chamber 19, for example, the over-the-air measurement chamber.

It is noted that at least a part or all of the remaining parts and elements of the measurement system 10$f$ can be located within said measurement chamber 19, for example, said over-the-air measurement chamber.

Figure 7:
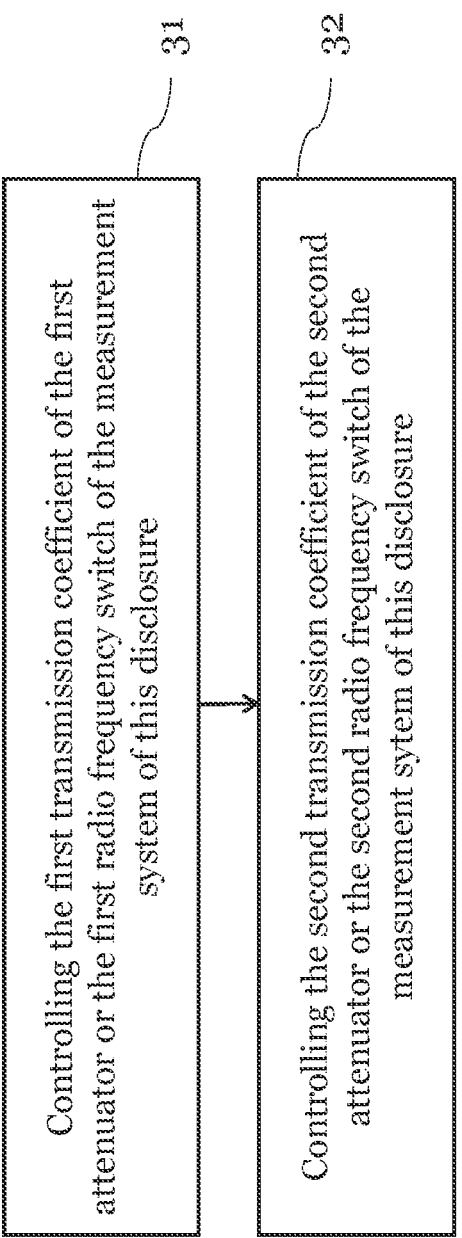
FIG. 7 shows a flow diagram of a measurement method according to the second aspect of this disclosure.

Furthermore, FIG. 7 illustrates a flow diagram of an exemplary embodiment of the measurement method of this disclosure.

In accordance with said FIG. 7, for the exemplary case that the measurement method uses the measurement system of this disclosure, such as the measurement system 10$a$ of FIG. 1, a first step 31 comprises controlling the first transmission coefficient of the first attenuator or the first radio frequency switch. In addition to this, a second step 32 comprises controlling the second transmission coefficient of the second attenuator or the second radio frequency switch.

Finally, FIG. 8 shows a flow diagram of a further exemplary embodiment of the measurement method of this disclosure.

According to said FIG. 8, especially for the case that the measurement method does not necessarily use the measurement system of this disclosure, a first step 21 comprises connecting a first radio frequency port, such as the first radio frequency port 13$a$, to a first measurement chain, such as the first measurement chain 11$a$, via a radio frequency hybrid coupler, such as the radio frequency hybrid coupler 12. A second step 22 comprises connecting a second radio frequency port, such as the second radio frequency port 13$b$, to a second measurement chain, such as the second measurement chain 11$b$, via the radio frequency hybrid coupler.

Furthermore, as it can be seen from FIG. 8, a third step 23 comprises providing a first attenuator, such as the first attenuator 14$a$, or a first radio frequency switch for the first radio frequency port. A fourth step 24 comprises providing a second attenuator, such as the second attenuator 14$b$, or a second radio frequency switch for the second radio frequency port.

Moreover, a fifth step 25 comprises controlling a first transmission coefficient of the first attenuator or the first radio frequency switch. In addition to this, a sixth step 26 comprises controlling a second transmission coefficient of the second attenuator or the second radio frequency switch.

Especially in the light of the computer program of the third aspect of this disclosure, it is noted that it might be advantageous if said computer program with computer program means performs the above-mentioned steps of controlling the first transmission coefficient of the first attenuator or the first radio frequency switch, and controlling the second transmission coefficient of the second attenuator or the second radio frequency switch.

In addition to this or as an alternative, it might be advantageous if said computer program with computer program means performs the above-mentioned steps of providing the first attenuator or the first radio frequency switch for the first radio frequency port, and providing the second attenuator or the second radio frequency switch for the second radio frequency port.

Accordingly, it might be advantageous if the first attenuator or the first radio frequency switch is implemented as a first software attenuator or a first software radio frequency switch. Furthermore, it might be advantageous if the second attenuator or the second radio frequency switch is implemented as a second software attenuator or a second software radio frequency switch.

All features described above or features shown in the figures can be combined with each other in any advantageous manner within the scope of the disclosure.

What is claimed is:

1. A measurement system comprising:
a first measurement chain,
a second measurement chain,
a radio frequency hybrid coupler comprising or being a magic tee coupler,
a first radio frequency port connected to the first measurement chain via the radio frequency hybrid coupler, wherein the first radio frequency port comprises or is connected to a first antenna,
a second radio frequency port connected to the second measurement chain via the radio frequency hybrid coupler, wherein the second radio frequency port comprises or is connected to a second antenna,
a first attenuator or a first radio frequency switch for the first radio frequency port, and
a second attenuator or a second radio frequency switch for the second radio frequency port,
wherein a first transmission coefficient of the first attenuator or the first radio frequency switch is controllable,
wherein a second transmission coefficient of the second attenuator or the second radio frequency switch is controllable,
wherein the first transmission coefficient and the second transmission coefficient are controllable to be the same between the radio frequency hybrid coupler and the first antenna and the second antenna,
wherein the first transmission coefficient is controllable to be alternated between 1% and 99%, and/or
wherein the second transmission coefficient is controllable to be alternated between 1% and 99%.

2. The measurement system according to claim 1,
wherein the first measurement chain is configured as a receive measurement chain, and/or
wherein the second measurement chain is configured as a transmit measurement chain.

3. The measurement system according to claim 1,
wherein the first measurement chain comprises and/or uses a first frequency converter, and/or
wherein the second measurement chain comprises and/or uses a second frequency converter.

4. The measurement system according to claim 3,
wherein the first frequency converter is configured as a receive frequency converter, and/or
wherein the second frequency converter is configured as a transmit frequency converter.

5. The measurement system according to claim 1,
wherein the first antenna is configured for a first polarization, and/or
wherein the second antenna is configured for a second polarization.

6. The measurement system according to claim 5,
wherein the first polarization is different from the second polarization, and/or
wherein the first polarization is orthogonal to the second polarization.

7. The measurement system according to claim 1,
wherein the first attenuator and the second attenuator or the first radio frequency switch and the second radio frequency switch are respectively configured such that only one of the first attenuator and the second attenuator or only one of the first radio frequency switch and the second radio frequency switch is enabled at the same time.

8. The measurement system according to claim 1,
wherein the first transmission coefficient is controllable to be alternated between 5% and 95%, or between 10% and 90%, and/or
wherein the second transmission coefficient is controllable to be alternated between 5% and 95%, or between 10% and 90%.

9. The measurement system according to claim 1,
wherein the measurement system further comprises an orthomode transducer for the first radio frequency port and the second radio frequency port.

10. The measurement system according to claim 1,
wherein the measurement system further comprises a dual polarized antenna with two orthogonal polarizations, connected to the first radio frequency port and the second radio frequency port.

11. The measurement system according to claim 1,
wherein the measurement system further comprises an over-the-air measurement chamber,
wherein the first antenna and the second antenna are located at two different locations within said measurement chamber.

12. The measurement system according to claim 1,
wherein the first antenna and the second antenna are arranged to transmit into and/or receive from different directions.

13. The measurement system according to claim 1,
wherein the first transmission coefficient is controllable in magnitude and/or phase, and/or
wherein the second transmission coefficient is controllable in magnitude and/or phase.

14. The measurement system according to claim 1,
wherein the first transmission coefficient and the second transmission coefficient are controllable to be the same between the radio frequency hybrid coupler and the first radio frequency port and the second radio frequency port.

15. The measurement system according to claim 1,
wherein the measurement system is configured to perform at least one measurement with the first measurement chain and the second measurement chain at the same time.

16. A measurement method using the measurement system of claim 1, the measurement method comprising the steps of:
controlling the first transmission coefficient of the first attenuator or the first radio frequency switch, and
controlling the second transmission coefficient of the second attenuator or the second radio frequency switch,
wherein the first transmission coefficient is controllable to be alternated between 1% and 99%, and/or
wherein the second transmission coefficient is controllable to be alternated between 1% and 99%.

17. A non-transitory computer-readable storage medium storing instructions which, when executed by a computer, cause the computer to carry out the steps according to claim 16.

* * * * *